(12) United States Patent
Park et al.

(10) Patent No.: US 8,139,406 B2
(45) Date of Patent: Mar. 20, 2012

(54) NON-VOLATILE MEMORY SYSTEM AND PROGRAMMING METHOD OF THE SAME

(75) Inventors: Ki Tae Park, Seongnam-si (KR); Yeong Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 12/213,938

(22) Filed: Jun. 26, 2008

(65) Prior Publication Data

US 2009/0003066 A1 Jan. 1, 2009

(30) Foreign Application Priority Data

Jun. 27, 2007 (KR) .................. 10-2007-0063892

(51) Int. Cl.
*G11C 11/40* (2006.01)
(52) U.S. Cl. ......... 365/185.02; 365/189.05; 365/189.17; 365/185.19; 365/185.24
(58) Field of Classification Search ............. 365/185.02, 365/189.05, 189.17, 185.19, 185.24
See application file for complete search history.

(56) References Cited

U.S. PATENT DOCUMENTS

| | | | |
|---|---|---|---|
| 7,257,027 B2 * | 8/2007 | Park | 365/185.11 |
| 7,260,017 B2 | 8/2007 | Won | |
| 2003/0214853 A1 * | 11/2003 | Hosono et al. | 365/200 |
| 2004/0141374 A1 * | 7/2004 | Park et al. | 365/185.08 |
| 2005/0157552 A1 * | 7/2005 | Hemink et al. | 365/185.03 |
| 2006/0087893 A1 * | 4/2006 | Nishihara et al. | 365/189.01 |
| 2007/0002621 A1 * | 1/2007 | Park | 365/185.11 |
| 2007/0067701 A1 * | 3/2007 | Shimosato et al. | 714/770 |

FOREIGN PATENT DOCUMENTS

| | | |
|---|---|---|
| JP | 08-195090 | 7/1996 |
| KR | 10-2003-0051043 A | 6/2003 |
| KR | 10-2005-0064666 A | 6/2005 |
| KR | 10-2006-0099929 A | 9/2006 |

* cited by examiner

*Primary Examiner* — Hoai V Ho
*Assistant Examiner* — Jay Radke
(74) *Attorney, Agent, or Firm* — Lee & Morse, P.C.

(57) ABSTRACT

A programming method for a non-volatile memory system includes storing multi-page program data and buffering the multi-page program data from a page buffer to a memory block and programming the multi-page program data through a predetermined number of program operations. The programming the multi-page program data includes programming memory cells of the memory block using a first threshold voltage lower than a desired threshold voltage based on the multi-page program data sequentially buffered by the page buffer in units of pages and programming the memory cells using the desired threshold voltage by increasing a threshold voltage of the memory cells by a predetermined level at each successive program operation.

46 Claims, 11 Drawing Sheets

NON-VOLATILE MEMORY SYSTEM AND PROGRAMMING METHOD OF THE SAME

BACKGROUND OF THE INVENTION

1. Field of the Invention

Embodiments relate to a non-volatile memory system and a programming method of the same. More particularly, embodiments relate to a programming method for reducing a coupling effect between memory cells in a NAND non-volatile memory system and a non-volatile memory system for performing the programming method.

2. Description of the Related Art

Figure 1:
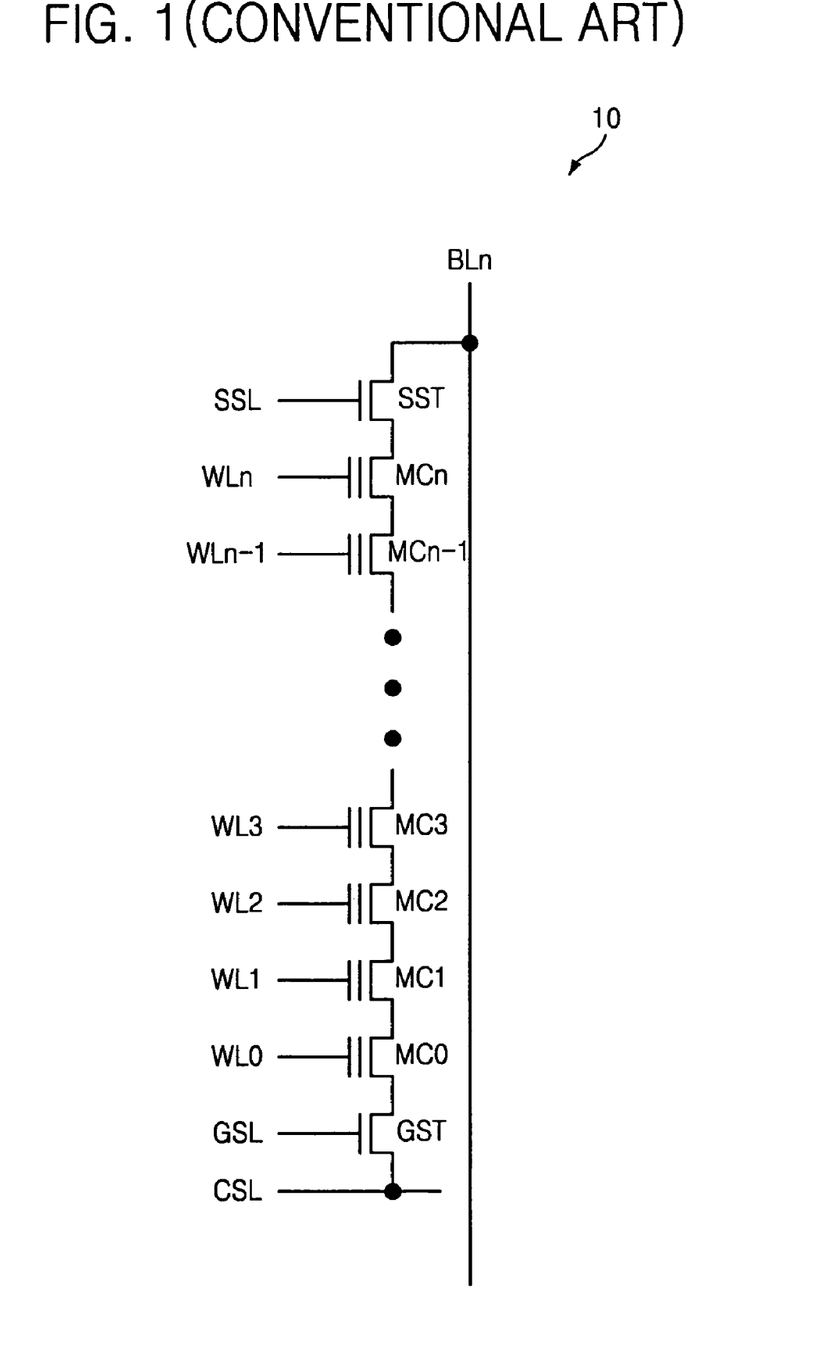
FIG. 1 illustrates a memory cell array of a conventional NAND non-volatile memory system.

FIG. 1 illustrates a memory cell array 10 of a conventional NAND non-volatile memory system. Referring to FIG. 1, the memory cell array 10 includes a bitline BLn, a plurality of wordlines WL0 through WLn, a string selection line SSL, a ground selection line GSL, a common source line CSL, a string selection transistor SST, a ground selection transistor GST, and a plurality of memory cells MC0 through MCn.

The string selection transistor SST is connected with the bitline BLn and controlled via the string selection line SSL. The ground selection transistor GST is connected with the common source line CSL and is controlled via the ground selection line GSL. The wordlines WL0 through WLn are connected with gates of memory cells MC0 through MCn, respectively, and apply a control voltage to respective memory cells MC0 through MCn. The memory cells MC0 through MCn are connected in series between the string selection transistor SST and the ground selection transistor GST to form a single string. Typically, a non-volatile memory system, e.g., a flash memory system, electrically reads data from, programs data to, and erases data from memory cells MC0 through MCn.

Figure 2:
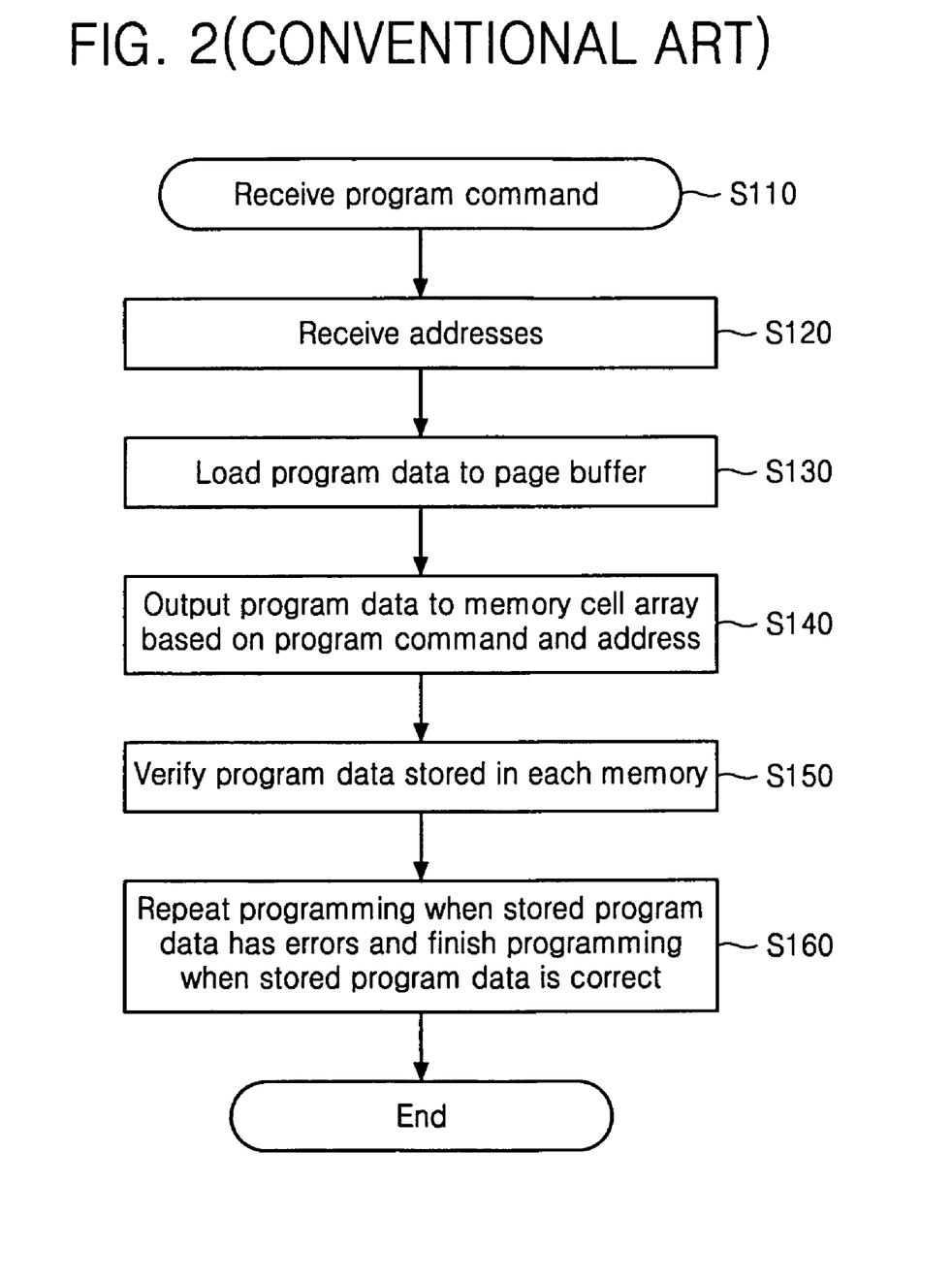
FIG. 2 illustrates a flowchart of a method of programming the memory cell array illustrated in FIG. 1.

FIG. 2 illustrates a flowchart of a programming method of the NAND flash memory system illustrated in FIG. 1. Referring to FIGS. 1 and 2, the non-volatile memory system receives program commands and addresses in operations S110 and S120. The non-volatile memory system loads program data to a page buffer in operation S130 and outputs the program data to the memory cell array 10 based on the program commands and addresses to perform programming in units of pages in operation S140. After the programming, the memory system verifies the program data stored in each of the memory cells MC0 through MCn in operation S150. The memory system repeats the programming when the stored program data has errors and finishes the programming of the page when the stored program data is correct in operation S160.

Figure 3:
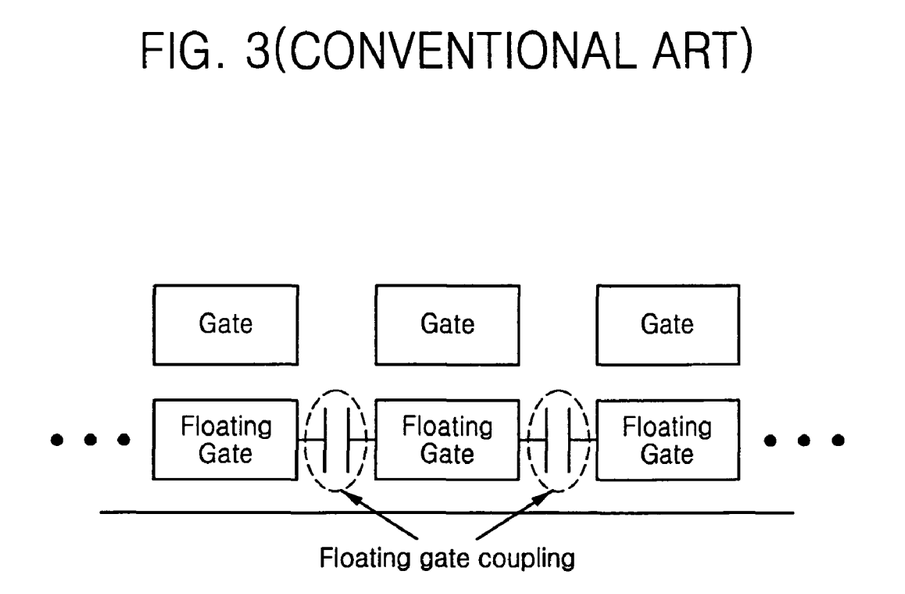
FIG. 3 illustrates a coupling effect between memory cells illustrated in FIG. 1.

However, as illustrated in FIG. 3, a coupling effect, in which charge stored at floating gates moves between floating gates of adjacent cells, occurs in conventional non-volatile memory systems during programming. In addition, the coupling effect is caused by the change in the amount of pure charge between adjacent cells in charge trap flash (CTF) memory systems.

Figure 4:
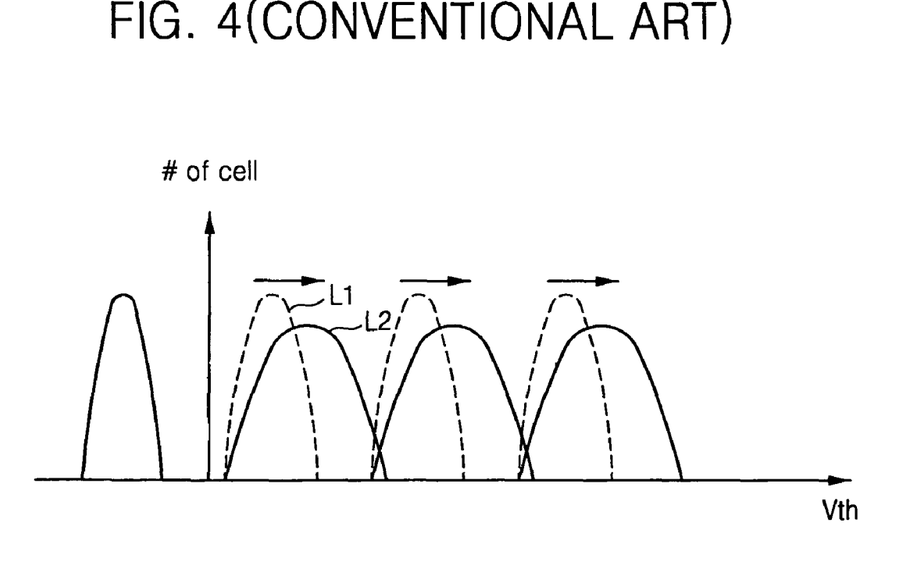
FIG. 4 illustrates the change in variation of threshold voltage, which is caused by the coupling effect illustrated in FIG. 3.

Due to the coupling effect, memory cells have a wider variation L2 of threshold voltage than a desired variation L1 of threshold voltage, as illustrated in FIG. 4. Due the increased variation of threshold voltage, a window margin between threshold voltages is decreased, which makes it difficult to clearly distinguish data. For this reason, it is necessary to increase the programmed threshold voltage to a predetermined level and repeat the programming.

However, when multiple (e.g., three) variations of threshold voltage overlap, the level of the initially programmed threshold voltage cannot be detected. Therefore, programming cannot be accurately performed even by re-programming.

SUMMARY OF THE INVENTION

Embodiments are therefore directed to a non-volatile memory system and programming method, which substantially overcome one or more of the problems and limitations of the related art.

It is therefore a feature of an embodiment to provide a programming method of a non-volatile memory system for reducing a coupling effect between adjacent cells in the non-volatile memory system and a memory system for transmitting data in units of blocks.

At least one of the above and other features and advantages may be realized by providing a programming method of a non-volatile memory device. The programming method includes storing multi-page program data and programming the multi-page program data using a predetermined N number of program operations where N is an integer greater than or equal to 2. The programming of the multi-page program data includes a first program operation of sequentially buffering the program data from a page buffer to a memory block and programming memory cells in the memory block with a first threshold voltage, and second through N-th program operations of, after a previous program operation based on the program data is completed, sequentially buffering the program data from the page buffer to the memory block again and programming the memory cells in the memory block with a threshold voltage increased by a predetermined level from a previous threshold voltage of the memory cells.

Each of the first through N-th program operations may include programming memory cells corresponding to an i-th page where "i" is a natural number; verifying data in the memory cells of the i-th page; and repeating the programming of the memory cells of the i-th page and the verifying of the data in the memory cells when the memory cells of the i-th page have not been correctly programmed based on a result of the verification, and performing programming and verification of an (i+1)-th page when the memory cells of the i-th page have been correctly programmed.

When the i-th page is a last page in the memory block or corresponds to a last page of the program data, the j-th program operation may be completed and the (j+1)-th program operation may be performed where "j" is an integer from 1 to N−1.

When the memory block is completely programmed, a next memory block may be programmed.

At least one of the above and other features and advantages may be realized by providing a programming method of a non-volatile memory device. The programming method includes storing multi-page program data in a block buffer, and programming memory cells with a desired threshold voltage by performing, at least twice, a program operation of sequentially programming the memory cells by outputting the program data from the block buffer to the memory cells in units of pages. Here, a threshold voltage of the memory cells is increased at every repetition of the program operation until the threshold voltage reaches the desired threshold voltage.

At least one of the above and other features and advantages may be realized by providing a non-volatile memory device including a memory cell array having a plurality of wordlines, a plurality of bitlines, and a plurality of memory blocks connected with the wordlines and the bitlines, and a page buffer configured to sequentially receive multi-page program data in units of pages and sequentially output the multi-page program data to the memory cell array. Memory cells of each of the memory blocks are programmed with a desired threshold voltage based on the program data buffered by the page buffer using a predetermined number N, where N is an integer greater than or equal to 2, of program operations, and at each subsequent program operations, a threshold voltage of the memory cells is increased.

The program data may be stored in units of blocks and the stored program data may be output in units of pages.

The non-volatile memory device may further include a block buffer configured to store the program data, and a cache buffer configured to temporarily store single page data output from the block buffer and output the single page data to the page buffer. Each of the memory cells can store m-bit data where "m" is a natural number.

At least one of the above and other features and advantages may be realized by providing a non-volatile memory system including the above-described non-volatile memory device, and a controller configured to control a program operation of the memory device. The controller may include a block buffer configured to store program data received from a host in units of blocks. Alternatively, the non-volatile memory system may further include a block buffer between the page buffer and the controller to store program data received via the controller in units of blocks.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0063892, filed on Jun. 27, 2007, in the Korean Intellectual Property Office, and entitled: "Non-Volatile Memory System and Programming Method of the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 5:
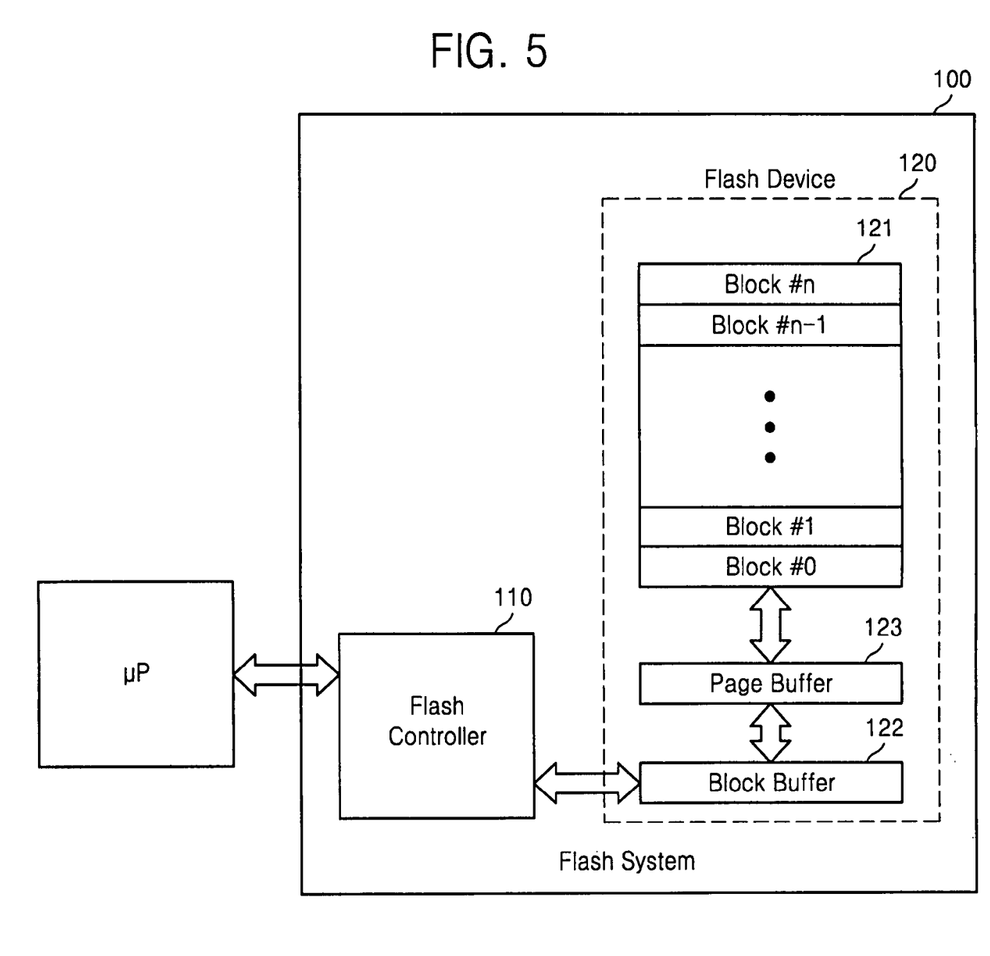
FIG. 5 illustrates a schematic block diagram of a non-volatile memory system according to some embodiments of the present invention.
Figure 6:
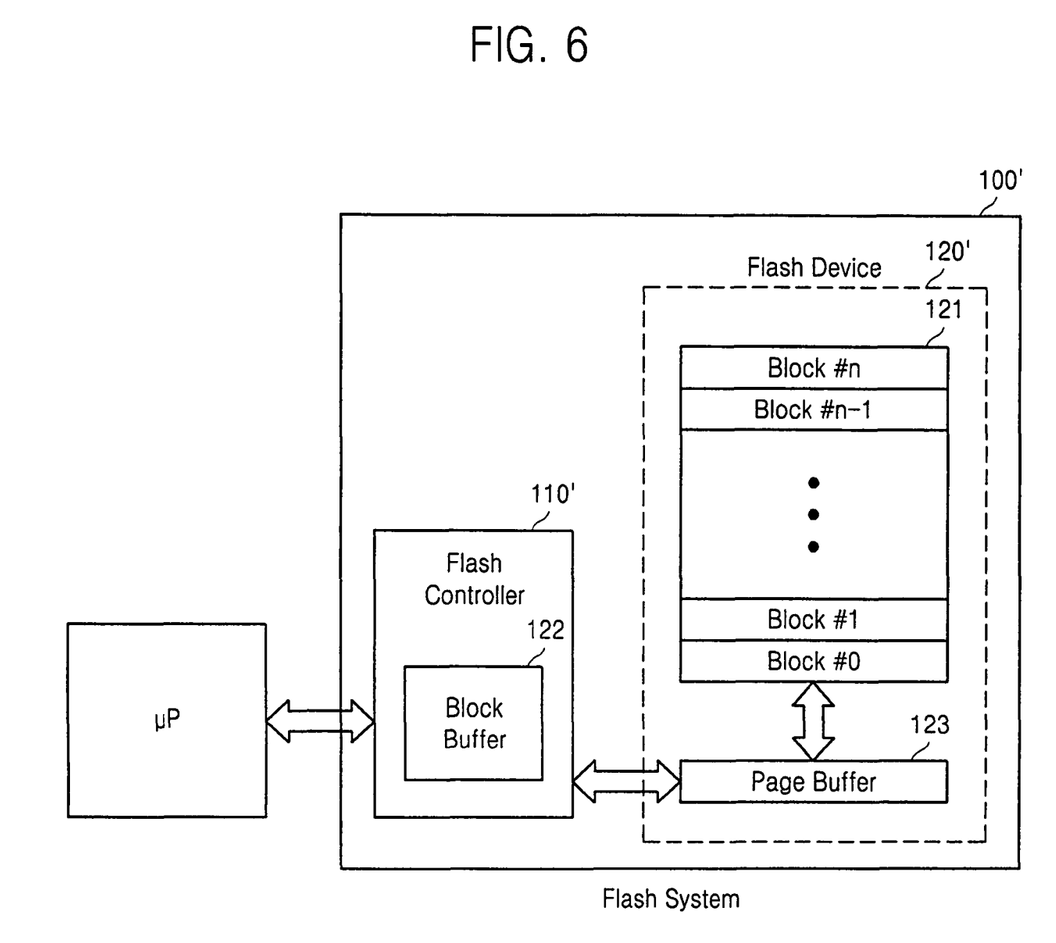
FIG. 6 illustrates a schematic block diagram of a non-volatile memory system according to other embodiments of the present invention.
Figure 7:
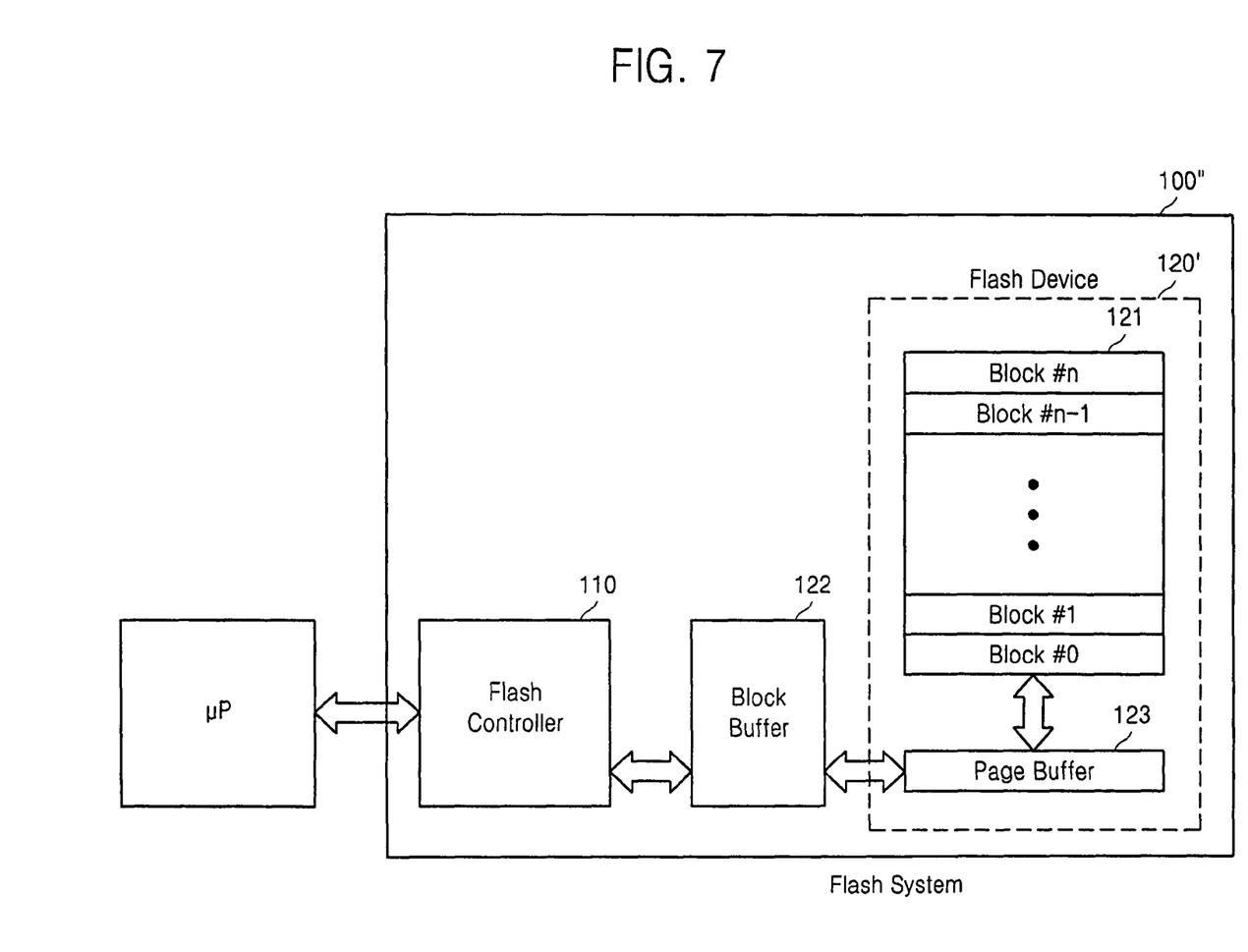
FIG. 7 illustrates a schematic block diagram of a non-volatile memory system according to further embodiments of the present invention.

FIG. 5 illustrates a schematic block diagram of a non-volatile memory system 100 according to some embodiments of the present invention. FIG. 6 illustrates a schematic block diagram of a non-volatile memory system 100' according to other embodiments of the present invention. FIG. 7 illustrates a schematic block diagram of a non-volatile memory system 100" according to further embodiments of the present invention.

Referring to FIG. 5, the non-volatile memory system 100 may include a controller 110 and a non-volatile memory device 120. The controller 110 may output a read command or a program command to the memory device 120 based on a command and an address received from a host, e.g., a microprocessor μP.

The memory device 120 may include a memory cell array 121, including a plurality of memory blocks Block#0 through Block#n, a block buffer 122, and a page buffer 123. Each of the memory blocks Block#0 through Block#n may include a plurality of memory cells. Each memory cell may be implemented by a multi-level memory cell that can store multi-bit data. The block buffer 122 may store a block or multiple pages of program data (or block program data or multi-page program data) received via the controller 110. After completing the storing of data, the block buffer 122 may sequentially output the pages of the program data to the page buffer 123. The page buffer 123 may output a page of the program data to one of the memory blocks Block#0 through Block#n to perform programming. At this time, the block buffer 122 may store the block program data until the block program data is completely stored in a corresponding one of the memory blocks Block#0 through Block#n. A programming method of the memory device 120 will be described in detail later.

When data stored in the memory cell array 121 is read, the read data may be temporarily stored only in the page buffer 123, i.e., may be output without being stored in the block buffer 122.

Although the block buffer 122 is included in the memory device 120 in the non-volatile memory system 100 illustrated in FIG. 5, as illustrated in FIG. 6, the non-volatile memory system 100', the block buffer 122 may be included in a controller 110', or, as illustrated in FIG. 7, the non-volatile memory system 100", the block buffer 122 may be separately implemented between the controller 110 and a memory device 120'. The block buffer 122 illustrated in FIGS. 5 through 7 may be implemented, for example, by dynamic random access memory (DRAM), static random access memory (SRAM), phase random access memory (PRAM), ferroelectric random access memory (FRAM), resistive random access memory (RRAM), or magnetic random access memory (MRAM).

Figure 8:
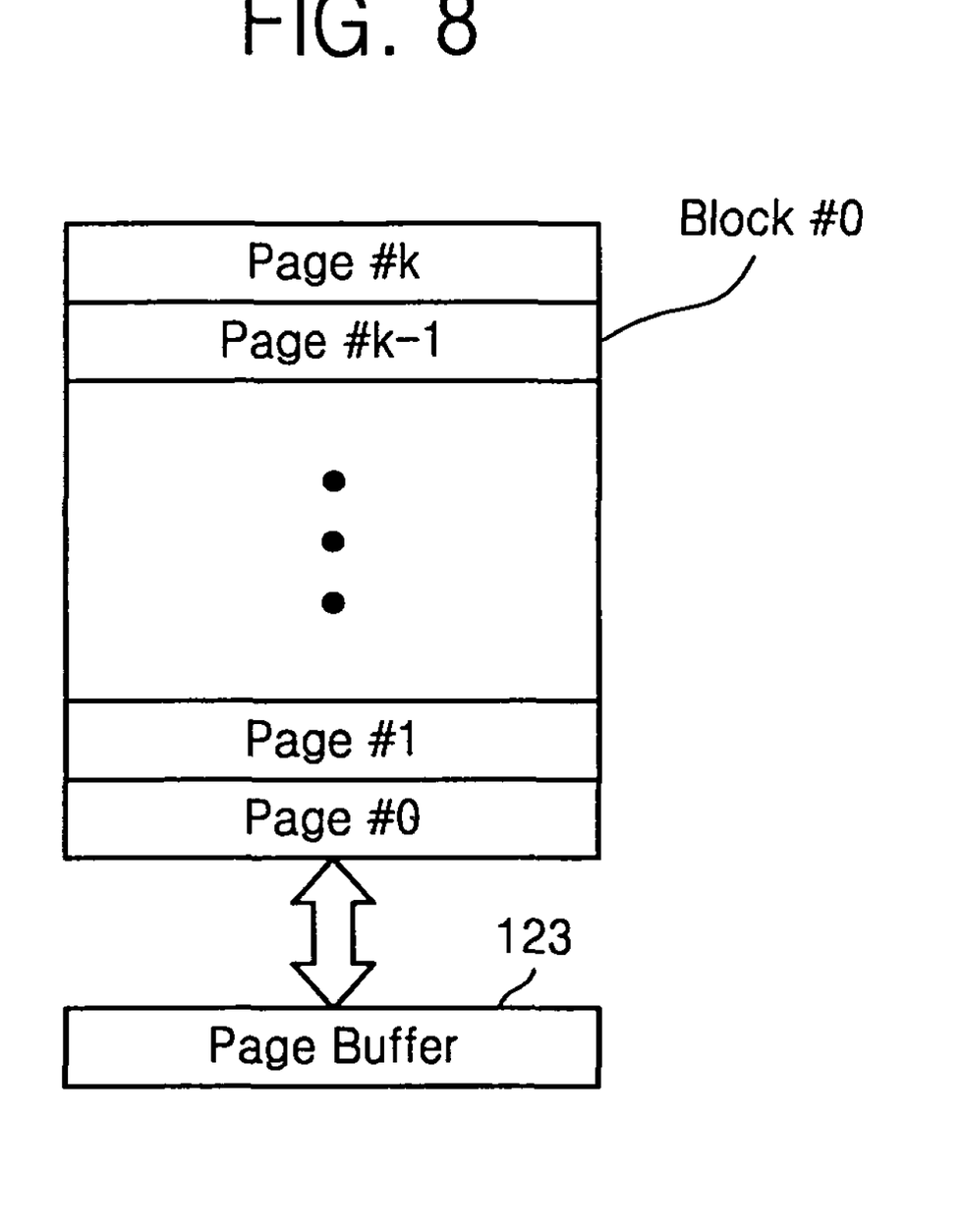
FIG. 8 illustrates a schematic block diagram of a memory block illustrated in FIGS. 5 through 7.

FIG. 8 illustrates a schematic block diagram of one memory block Block#0 among the memory blocks Block#0 through Block#n illustrated in FIGS. 5 through 7. Referring to FIGS. 5 through 8, each of the memory blocks Block#0 through Block#n may include a plurality of memory pages Page#0 through Page#k. Each of the memory pages Page#0 through Page#k may include a plurality of memory cells (not shown), may receive program data from the page buffer 123, and may store the program data in the memory cells.

Figure 9:
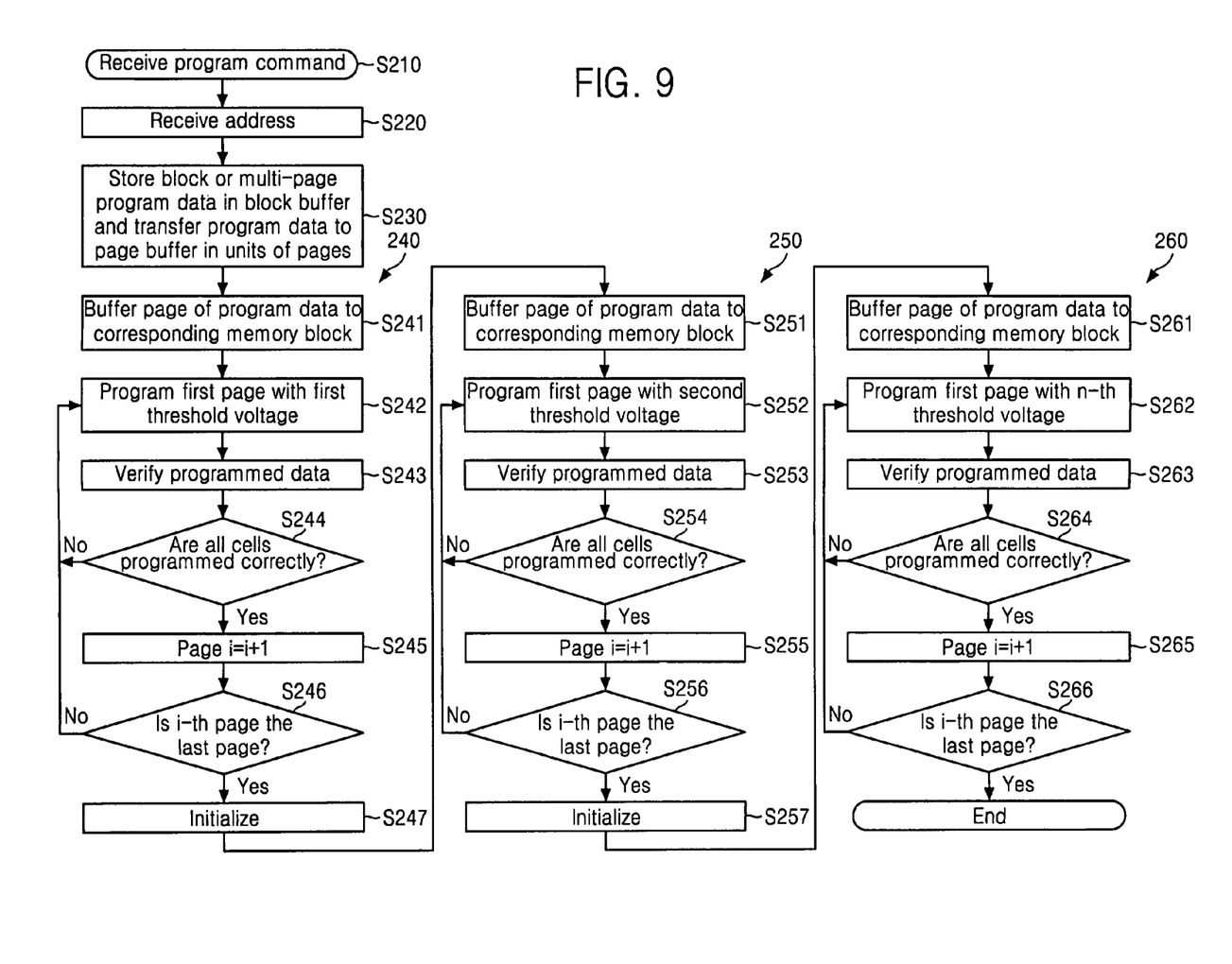
FIG. 9 illustrates a flowchart of a programming method of a non-volatile memory system, according to some embodiments of the present invention.

FIG. 9 illustrates a flowchart of a programming method of a non-volatile memory system, according to some embodiments of the present invention. Referring to FIGS. 5 through 9, the controller 110, 110' may receive a program command and an address from a host, and may output them to the memory device 120, 120' in operations S210 and S220. The block buffer 122 may store block or multi-page program data received via the controller 110, 110', and may output the stored program data to the page buffer 123 in units of pages in operation S230. The page buffer 123 may buffer the program data output from the block buffer 122 in units of pages, and may output each page of the program data to a corresponding one (e.g., Block#0) of the memory blocks Block#0 through Block#n in operation S241. In other words, the non-volatile memory system 100, 100', 100" may program a single memory block or a group of memory pages through a predetermined number (e.g., N where N is an integer greater than or equal to 2) of program operations based on data stored in the block buffer 122 in operations S240, S250, and S260.

In detail, a first program operation 240 may be performed with a threshold voltage lower than a desired threshold voltage corresponding to the program data output from the page buffer 123. Then, additional program operations, e.g., 2 to N program operations, where N is an integer greater than or equal to 2, e.g., program operations 250, 260, may be performed with an increased threshold voltage compared to a previous program operation. The threshold voltage may be increased at each repeated program operation up to the desired threshold voltage until memory cells are programmed with the desired threshold voltage.

For clarity of description, programming the first memory block Block#0 will be explained as an example of programming. The non-volatile memory system 100, 100', 100" may perform the first program operation S240 in which memory cells in the first memory block Block#0 corresponding to data stored in the block buffer 122 is programmed with a first threshold voltage, which is lower than the desired threshold voltage.

In detail, the page buffer 123 may receive program data from the block buffer 122 and may buffer the program data to the first memory block Block#0 in operation S241. The non-volatile memory system 100, 100', 100" may program memory cells in the first memory block Block#0 in order of memory cells of the first memory page Page#0 to memory cells of the (k+1)-th memory page Page#k using the first threshold voltage in operation S242.

The program operation for each memory page may be performed by verifying programmed data in operation S243 and by determining whether all cells of the memory page are correctly programmed based on a result of the verification in operation S244. When operation S244 determines that the cells of the memory page have not been correctly programmed, operations S242 to S244 may be repeated. When operation S244 determines that the cells of the memory page have been correctly programmed, a next memory page may be set by operation S245. When operation S246 determines that a next memory page Page#i is not the last memory page Page#k in the first memory block Block#0, operations S242 to S246 may be repeated so that a next memory page Page#i may be programmed with the first threshold voltage. When operation S246 determines that the last memory page Page#k in the first memory block Block#0 has been completely programmed, a memory page count is initialized in operation S247.

After completing the first program operation S240 for the first memory block Block#0, the non-volatile memory system 100, 100', 100" may perform the second program operation S250 in which the first memory block Block#0 is programmed with a second threshold voltage, which is higher than the first threshold voltage and lower than the desired threshold voltage.

The page buffer 123 may receive the program data from the block buffer 122 and may buffer the program data to the first memory block Block#0 in operation S251. The non-volatile memory system 100, 100', 100" may program the memory cells in the first memory block Block#0 in order of the memory cells of the first memory page Page#0 to the memory cells of the (k+1)-th memory page Page#k using the second threshold voltage in operation S252. In other words, the non-volatile memory system 100, 100', 100" may perform the program operation with respect to the first memory block Block#0 using the second threshold voltage higher than the first threshold voltage by a predetermined level.

In the same manner as the first program operation S240, the second program operation S250 for each memory page may be performed by verifying programmed data in operation S253 and by determining whether all cells of the memory page are correctly programmed based on a result of the verification in operation S254. When operation S254 determines that the cells of the memory page have not been correctly programmed, operations S252 to S254 may be repeated. When operation S254 determines that the cells of the memory page have been correctly programmed, a next memory page may be set by operation S255. When operation S256 determines that a next memory page Page#i is not the last memory page Page#k in the first memory block Block#0, operations S252 to S256 may be repeated so that a next memory page Page#i may be programmed with the second threshold voltage. When operation S256 determines that the last memory page Page#k in the first memory block Block#0 has been completely programmed, a memory page count is initialized in operation S257.

Consequently, the non-volatile memory system 100, 100', 100" may repeat program operations with respect to the first memory block Block#0 a predetermined number N, where N is a natural number, of times. The threshold voltage of the memory cells may be increased at each iteration of program operations up to the desired threshold voltage, thereby eventually programming the first memory block Block#0 with the desired threshold voltage corresponding to the received block program data.

Accordingly, in the same manner as the first and second program operations, an N-th program operation S260 may include buffering the program data output from the block buffer 122 to the first memory block Block#0 in operation S261, programming memory cells in the first memory block Block#0 in order of the memory cells of the first memory page Page#0 to the memory cells of the (k+1)-th memory page Page#k with an N-th threshold voltage in operation S262, verifying programmed data in operation S263, determining whether all cells in the first memory block Block#0 are correctly programmed with the N-th threshold voltage operation S264, programming a next page Page#i with the N-th threshold voltage, set in operation S265, when operation S266 determines that the next page Page#i is not the last page Page#k by repeating operations S262 to S266 and, when operation S266 determines that the (k+1)-th memory page Page#k has been completely programmed, finishing the programming of the first memory block Block#0. The N-th threshold voltage may be the desired threshold voltage corresponding to the received program data.

Figure 10A:
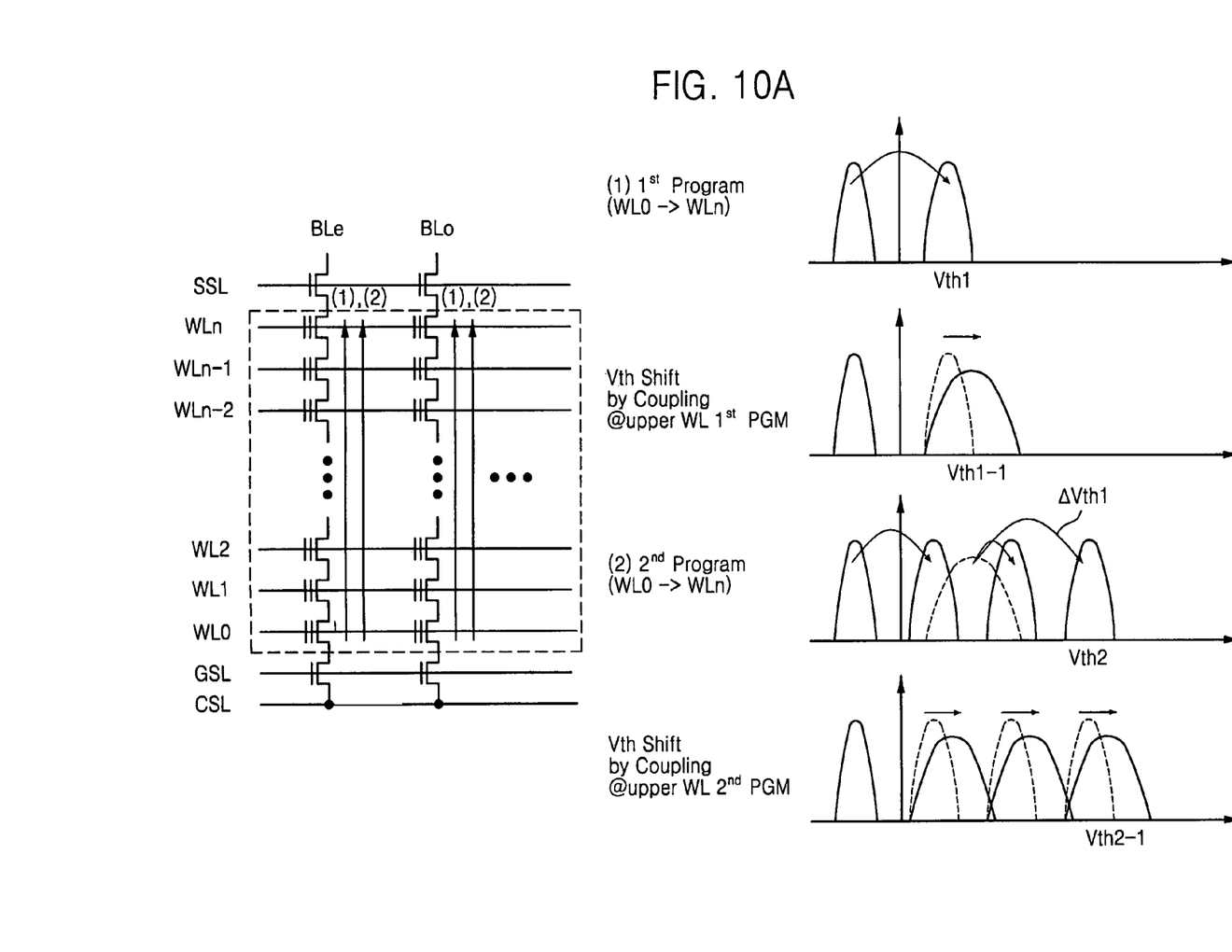
FIGS. 10A and 10B illustrate diagrams for explaining program operations at different stages illustrated in FIG. 9.
Figure 10B:
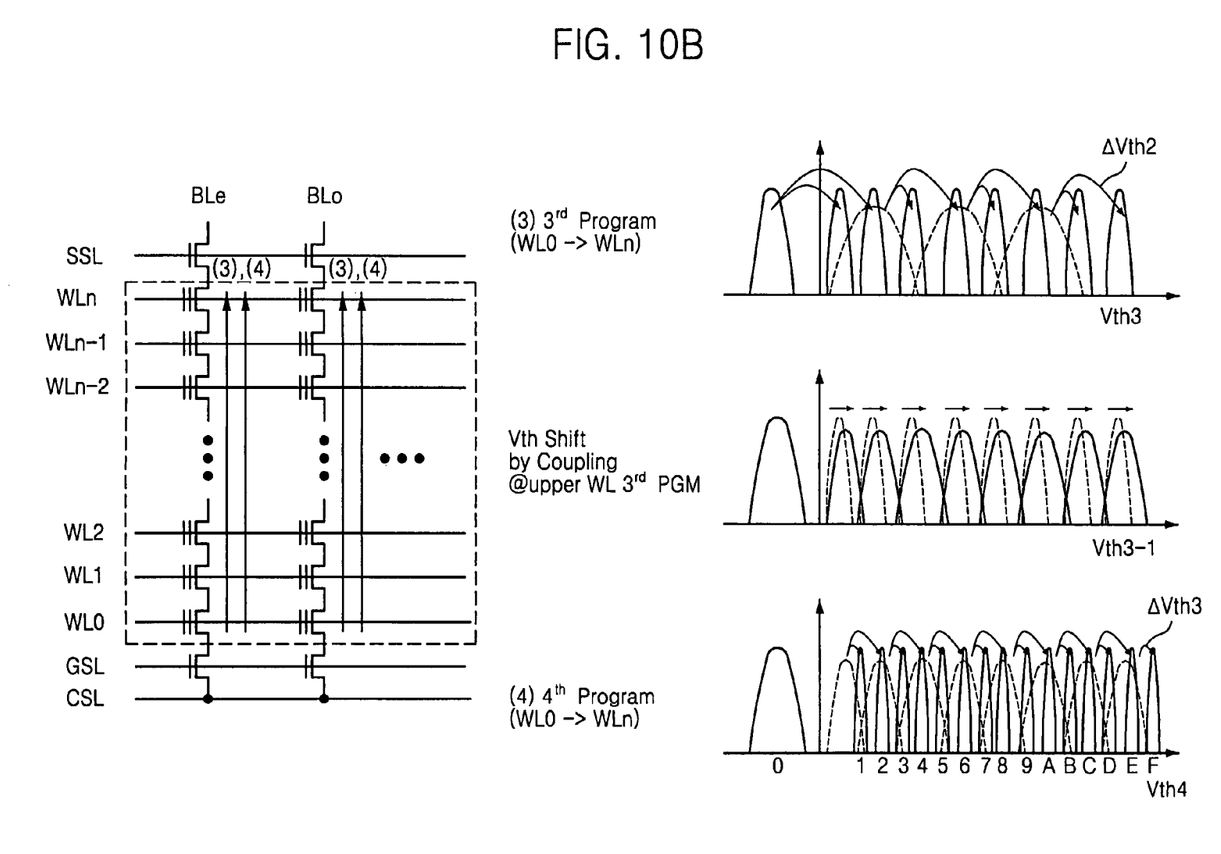

FIGS. 10A and 10B illustrate diagrams for explaining the program operations illustrated in FIG. 9. For clarity of description, the memory cells are assumed to have a 16-level threshold voltage to store 4-bit data. Referring to FIGS. 10A and 10B, a memory system implemented using memory cells that can store 4-bit data can program data with a desired threshold voltage using four program operations.

For example, when memory cells are programmed to a highest threshold voltage level "F", the memory system may program a memory block or a plurality of memory pages using a first threshold voltage Vth1 in a first program operation (1). After the first program operation is completed, memory cells programmed with the first threshold voltage Vth1 have a threshold voltage variation Vth1-1 due to a coupling effect between adjacent cells.

Thereafter, the memory system may program memory cells with a second threshold voltage Vth2, greater than the first threshold voltage Vth1 by ΔVth1, in a second program operation (2). After the second program operation is completed, memory cells programmed with the second threshold voltage Vth2 have a threshold voltage variation Vth2-1 due to a coupling effect between adjacent cells.

Thereafter, the memory system may program the memory cells with a third threshold voltage Vth3, greater than the second threshold voltage Vth2 by ΔVth2, in a third program operation (3). After the third program operation is completed, memory cells programmed with the third threshold voltage Vth3 have a threshold voltage variation Vth3-1 due to a coupling effect between adjacent cells.

Finally, the memory system may program memory cells with a fourth threshold voltage Vth4, greater than the third threshold voltage Vth3 by ΔVth3 and which equals the desired threshold voltage, in a fourth program operation (4), thereby programming the memory cells with the desired threshold voltage and finishing the programming of the memory block.

Although in embodiments, memory cells are programmed from a lowest threshold voltage level "0" to the highest threshold voltage level "F", they are programmed through N program operations in stages. Therefore, the change in threshold voltage between stages is small. For example, when four program operations are performed with respect to one memory block, the change in threshold voltage in each stage may be less than or equal to (the total change in threshold voltage)/4, e.g., generally each ΔVth may be less than or equal to a desired threshold voltage Vthd minus Vth1, and dividing this difference by N. The ΔVth between adjacent threshold voltages may be equal to one another or may vary, e.g., decrease as the threshold voltage increases. In addition, an (j+1)-th program operation may reduce or eliminate the change in threshold voltage that may be caused by a coupling effect between adjacent memory cells occurring in a previous j-th program operation, where j is an integer between 1 and N−1.

In the above-described embodiments, a NAND flash memory system using a floating gate has been explained, but embodiments may also reduce or eliminate the change in threshold voltage caused by a coupling effect occurring due to the change in pure charge between adjacent cells when it is used for charge trap flash (CTF) memory systems.

As compared to conventional programming of a memory system, embodiments increase the threshold voltage of memory cells in stages, thereby reducing a coupling effect between adjacent memory cells and securing a satisfactory window margin between threshold voltages. Therefore, embodiments may prevent or reduce the change in threshold voltage of memory cells that may be caused by a floating gate coupling effect between the memory cells and may perform programming of block or multi-page data.

Exemplary embodiments of the present invention have been disclosed herein, and although specific terms are employed, they are used and are to be interpreted in a generic and descriptive sense only and not for purpose of limitation. For example, the processing of the present invention may be implemented in software, e.g., by an article of manufacture having a machine-accessible medium including data that, when accessed by a machine, cause the machine to program a non-volatile memory device. Accordingly, it will be understood by those of ordinary skill in the art that various changes in form and details may be made without departing from the spirit and scope of the present invention as set forth in the following claims.

What is claimed is:

1. A programming method of a non-volatile memory device, comprising:
   storing multi-page program data; and
   programming the multi-page program data using a predetermined N number of program operations, where N is an integer greater than or equal to 2, the programming including:
      a first program operation of sequentially buffering the program data from a page buffer to a memory block and programming memory cells in the memory block with a first threshold voltage, and
      second through N-th program operations of, after a previous program operation based on the program data is completed, sequentially buffering the program data from the page buffer to the memory block again and programming the memory cells in the memory block with a threshold voltage increased by a predetermined level from a previous threshold voltage of the memory cells.

2. The programming method as claimed in claim 1, wherein each of the first through N-th program operations comprises:
   programming memory cells corresponding to an i-th page where "i" is a natural number;
   verifying data in the memory cells of the i-th page; and
   repeating the programming of the memory cells of the i-th page and the verifying of the data in the memory cells when the memory cells of the i-th page have not been correctly programmed based on a result of the verification, and performing programming and verification of an (i+1)-th page when the memory cells of the i-th page have been correctly programmed.

3. The programming method as claimed in claim 2, wherein when the i-th page is a last page in the memory block or corresponds to a last page of the program data, the j-th program operation is completed and the (j+1)-th program operation is performed where "j" is an integer from 1 to N−1.

4. The programming method as claimed in claim 3, wherein a threshold voltage used to program the memory cells in the j-th program operation is lower than a threshold voltage used to program the memory cells in the (j+1)-th program operation.

5. The programming method as claimed in claim 1, wherein each of the memory cells can store m-bit data where "m" is a natural number.

6. The programming method as claimed in claim 5, wherein "m" and N are 4.

7. A programming method of a non-volatile memory device, comprising:
   storing multi-page program data in a block buffer; and
   programming memory cells with a desired threshold voltage by performing, at least twice, a program operation of sequentially programming the memory cells by outputting the program data from the block buffer to the memory cells in units of pages,
   wherein a threshold voltage of the memory cells is increased at every repetition of the program operation until the threshold voltage reaches the desired threshold voltage, and
   wherein the program operation includes:
      programming memory cells corresponding to an i-th page where "i" is a natural number.,
      verifying data in the memory cells of the i-th page, and
      repeating the programming of the memory cells of the i-th page and the verifying of the data in the memory cells when the memory cells of the i-th page have not been correctly programmed based on a result of the verification, and performing programming and verification of an (i+1)-th page when the memory cells of the i-th page have been correctly programmed.

8. The programming method as claimed in claim 7, wherein the multi-page program data has a size smaller than or equal to a size of a memory block.

9. A non-volatile memory device, comprising:
   a memory cell array having a plurality of wordlines, a plurality of bitlines, and a plurality of memory blocks connected with the wordlines and the bitlines; and
   a page buffer configured to sequentially receive multi-page program data in units of pages and sequentially output the multi-page program data to the memory cell array, wherein memory cells of each of the memory blocks are programmed with a desired threshold voltage based on the program data buffered by the page buffer using a predetermined number N of program operations, where N is an integer greater than or equal to 2, and at each subsequent program operation, a threshold voltage of the memory cells is increased, and
   wherein the predetermined N number of program operations include:
      a first program operation of sequentially buffering the program data from the page buffer to a memory block selected from among the plurality of memory blocks and programming memory cells in the memory block with a first threshold voltage; and
      second through N-th program operations of, after a previous program operation based on the program data is completed, sequentially buffering the program data from the page buffer to the memory block again and programming the memory cells in the memory block with a threshold voltage increased by a predetermined level from a previous threshold voltage of the memory cells.

10. The non-volatile memory device as claimed in claim 9, wherein the program data is stored in units of blocks and the stored program data is output in units of pages.

11. The non-volatile memory device as claimed in claim 9, further comprising:
   a block buffer configured to store the program data; and
   a cache buffer configured to temporarily store single page data output from the block buffer and to output the single page data to the page buffer.

12. The non-volatile memory device as claimed in claim 11, wherein the block buffer is implemented by one of dynamic random access memory (DRAM), static random access memory (SRAM), phase random access memory (PRAM), ferroelectric random access memory (FRAM), resistive random access memory (RRAM), and magnetic random access memory (MRAM).

13. The non-volatile memory device as claimed in claim 9, wherein each of the memory cells can store m-bit data where "m" is a natural number.

14. The non-volatile memory device of as claimed in claim 9, wherein the non-volatile memory device is a floating gate NAND flash memory device or a charge trap NAND flash memory device.

15. A non-volatile memory system, comprising:
   the non-volatile memory device as claimed in claim 9; and
   a controller configured to control a program operation of the memory device.

16. The non-volatile memory system as claimed in claim 15, wherein the controller comprises a block buffer configured to store program data received from a host in units of blocks.

17. The non-volatile memory system as claimed in claim 15, further comprising a block buffer between the page buffer and the controller, the block buffer being configured to store program data received via the controller in units of blocks.

18. The non-volatile memory system as claimed in claim 17, wherein the block buffer is implemented by one of dynamic random access memory (DRAM), static random access memory (SRAM), phase random access memory (PRAM), ferroelectric random access memory (FRAM), resistive random access memory (RRAM), and magnetic random access memory (MRAM).

19. A method of operating a non-volatile memory device, comprising:
   storing multi-page program data in a nonvolatile memory buffer, the multi-page program data including a first page program data and a second page program data; and programming the multi-page program data to memory cells in memory blocks, the programming including:
a first operation of loading the multi-page program data from the nonvolatile memory buffer to a page buffer and programming the multi-page program data to the memory cells with a first threshold voltage, and thereafter
a second operation of, loading the multi-page program data from the nonvolatile memory buffer to the page buffer and programming the multi-page program data to the memory cells with a second threshold voltage that is higher than the first threshold voltage,
wherein the nonvolatile memory buffer is configured to store the first page program data and the second page program data until the first page program data and the second page program data are completely stored in a corresponding one of the memory blocks.

20. The method as claimed in claim 19, wherein each of the first and second operations comprises:
programming the memory cells corresponding to an i-th page where "i" is a natural number;
verifying data in the memory cells of the i-th page; and
repeating the step of programming the memory cells of the i-th page and the step of verifying the data in the memory cells when the memory cells of the i-th page have not been correctly programmed based on a result of the verification, and programming the memory cells and verifying data in the memory cells of an (i+1)-the page when the memory cells of the i-th page have been correctly programmed.

21. The method as claimed in claim 20, wherein when the i-th page is a last page in the memory block or corresponds to a last page of the program data, the j-th program operation is completed and the (j+1)-th program operation is performed where "j" is an integer from 1 to N-1.

22. The method as claimed in claim 21, wherein a threshold voltage used to program memory cells in the j-th program operation is lower than a threshold voltage used to program memory cells in the (j+1)-th program operation.

23. The method as claimed in claim 19, wherein each of the memory cells is configured to store m-bit data where "m" is a natural number equal to or greater than 2.

24. A method of operating a non-volatile memory device, comprising:
storing multi-page program data in a nonvolatile memory buffer, the multi-page program data including a first page program data and a second page program data; and
programming memory cells in memory blocks by performing, at least twice, an operation of loading the multi-page program data from the nonvolatile memory buffer to a page buffer and programming the multi-page program data from the page buffer to the memory cells,
wherein a threshold voltage of the memory cells is increased at every repetition of the operation, and
wherein the operation includes:
programming memory cells corresponding to an i-th page where "i" is a natural number;
verifying data in the memory cells of the i-th page; and
repeating the step of programming the memory cells of the i-th page and the step of verifying the data in the memory cells when the memory cells of the i-th page have not been correctly programmed based on a result of the verification, and programming the memory cells and verifying data in the memory cells of an (i+1)-th page when the memory cells of the i-th page have been correctly programmed, wherein the nonvolatile memory buffer is configured to store the first page program data and the second page program data until the first page program data and the second page program data are completely stored in a corresponding one of the memory blocks.

25. A method of operating a non-volatile memory device, comprising:
storing multi-page program data in a nonvolatile memory buffer;
programming memory cells by performing, at least twice, an operation of loading the multi-page program data from the nonvolatile memory buffer to a page buffer and programming the multi-page program data from the page buffer to the memory cells; and
reading the multi-page program data stored in the memory cells,
wherein a threshold voltage of the memory cells is increased at every repetition of the operation, and
wherein the multi-page program data read from the memory cells are temporarily stored in the page buffer and are output without being stored in the nonvolatile memory buffer.

26. The method as claimed in claim 25, wherein the multi-page program data has a size smaller than or equal to a size of a memory block.

27. A non-volatile memory device, comprising:
a memory cell array comprising a plurality of memory blocks;
a nonvolatile memory buffer configured to store multi-page program data until each page program data is completely stored in the memory cell array; and
a page buffer configured to receive the multi-page program data from the nonvolatile memory buffer and output the multi-page program data to the memory cell array,
wherein memory cells of each of the memory blocks are programmed with a threshold voltage based on the multi-page program data output by the page buffer using a predetermined number N of program operations, where N is an integer greater than or equal to 2.

28. The non-volatile memory device as claimed in claim 27, wherein respective program operations include:
a first operation of loading the multi-page program data from the nonvolatile memory buffer to the page buffer, and outputting the multi-page program data from the page buffer to a memory block of the plurality of memory blocks and programming the multi-page program data to memory cells in the memory block with a first threshold voltage; and
a second operations of, after the first operation based on the multi-page program data is completed, outputting the program data from the page buffer to the memory block and programming the multi-page program data to the memory cells in the memory block with a second threshold voltage that is higher than the first threshold voltage.

29. The non-volatile memory device as claimed in claim 28,
wherein the predetermined N number of program operations further include:
a third operations of, after the second operation based on the multi-page program data is completed, outputting the multi-page program data from the page buffer to the memory block and programming the multi-page program data into the memory cells in the memory block with a third threshold voltage that is higher than the second threshold voltage.

30. A non-volatile memory device, comprising:
a memory cell array comprising a plurality of memory blocks;
a nonvolatile memory buffer configured to store multi-page program data including a first page program data and a second page program data; and
a page buffer configured to receive the multi-page program data from the nonvolatile memory buffer and output the multi-page program data to the memory cell array, and further configured to temporarily store the multi-page program data read from the memory cell array,
wherein the multi-page program data read from the memory cell array are temporarily stored in the page buffer and are output without being stored in the nonvolatile memory buffer,
wherein the nonvolatile memory buffer is configured to store the first page program data and the second page program data until the first page program data and the second page program data are completely stored in a corresponding one of the memory blocks.

31. The non-volatile memory device as claimed in claim 30, wherein each of the memory cells stores m-bit data where "m" is a natural number equal to or greater than 2.

32. The non-volatile memory device as claimed in claim 30, wherein the non-volatile memory device comprises a floating gate NAND flash memory device or a charge trap NAND flash memory device.

33. A non-volatile memory system, comprising:
a non-volatile memory device; and
a controller configured to control a program operation of the non-volatile memory device,
wherein the controller transmits to the non-volatile memory device multi-page program data including a first page program data and a second page program data, and a program address fro the multi-page program data,
wherein the non-volatile memory device comprises:
a memory cell array comprising a plurality of memory blocks;
a block buffer configured to store multi-page program data; and
a page buffer configured to receive the multi-page program data from the nonvolatile buffer and output the multi-page program data to the memory cell array,
wherein memory cells of each of the memory blocks are programmed with a threshold voltage based on the multi-page program data loaded by the nonvolatile memory buffer using a predetermined N number of program operations, where N is an integer greater than or equal to 2, and at every program operation, a threshold voltage of the memory cells is increased,
wherein the nonvolatile buffer is configured to store the first page program data and the second page program data until the first page program data and the second page program adapt are completely stored in a corresponding one of the memory blocks.

34. A non-volatile memory system, comprising:
a non-volatile memory device; and
a controller configured to control a program operation of the non-volatile memory device,
wherein the non-volatile memory device comprises:
a memory cell array comprising a plurality of memory blocks;
a nonvolatile memory buffer configured to store multi-page program data including a a first page program data and a second page program data; and
a page buffer configured to receive the multi-page program data from the nonvolatile memory buffer and output the multi-page program data to the memory cell array, and further configured to temporarily store the multi-page program data read from the memory cell array,
wherein the multi-page program data read from the memory cell array are temporarily stored in the page buffer and are output without being stored in the nonvolatile memory buffer,
wherein the nonvolatile memory buffer is configured to store the first page program data and the second page program data until the first page program data and the second page program data are completely stored in a corresponding one of the memory blocks.

35. The non-volatile memory system as claimed in claim 34, wherein a threshold voltage of the memory cells is increased at every repetition of the program operation.

36. A method of operating a non-volatile memory device, comprising:
(a) storing multi-page program data in a nonvolatile memory buffer;
(b) loading the multi-page program data in the nonvolatile memory buffer to a page buffer; and
(c) programming memory cells in a memory block with a threshold voltage based on the multi-page program data loaded in the page buffer, and
wherein the steps of (b) and (c) are repeated N (N is an integer greater than or equal to 2) times,
wherein the threshold voltage of the memory cells is increased at every repetition of the program operation.

37. The method as claimed in claim 36, wherein the step of (c) comprises:
programming a first wordline through n-th wordline in the memory block, based on the multi-page data loaded in the page buffer.

38. The method as claimed in claim 36, wherein data is further loaded from the nonvolatile memory buffer to the page buffer to increase data amount of the page buffer according to repetition time of the program operation.

39. The method as claimed in claim 36, wherein a data amount loaded from the nonvolatile memory buffer to the page buffer is same regardless of repetition time of the program operation.

40. The method as claimed in claim 36, further comprising receiving a program command and address from a controller,
wherein the multi-page program data in the nonvolatile memory buffer are received from a controller.

41. A method of operating a non-volatile memory system, comprising:
(a) receiving a command and an address from a host;
(b) outputting multi-page program data to a memory device according to the command and the address;
(c) storing the multi-page program data in a nonvolatile memory buffer in the memory device; and
d) programming the multi-page program data to memory cells in memory blocks with a threshold voltage by performing, at least twice, a program operation of loading the multi-page program data from the nonvolatile memory buffer to a page buffer and programming the program data from the page buffer to the memory cells,
wherein the nonvolatile memory buffer is configured to store first page program data and second page program data until the first page program data and the second page program data are completely stored in a corresponding one of the memory blocks.

42. A method of programming a non-volatile memory device, comprising:
- storing multi-page program data including a first page program data and a second page program data in a nonvolatile memory buffer; and
- programming the multi-page program data in the nonvolatile memory buffer using a predetermined N number of program operations, where N is an integer equal to 3, the programming including:
  - a first program operation of loading the multi-page program data from the nonvolatile memory buffer to a page buffer and programming the program data to memory cells in memory blocks with a first threshold voltage,
  - a second program operations of, after the first program operation is completed, loading the multi-page program data from the nonvolatile memory buffer to the page buffer and programming the program data into the memory cells in the memory blocks with a second threshold that is higher than the first threshold voltage, and
  - a third program operations of, after the second program operation is completed, loading the program data from the nonvolatile memory buffer to the page buffer and programming the program data into the memory cells in the memory blocks with a third threshold voltage that is higher than the second threshold voltage,
  - wherein the nonvolatile memory buffer is configured to store the first page program data and the second page program data until the first page program data and the second page program data are completely stored in a corresponding one of the memory blocks.

43. A method of operating a semiconductor memory device, the method comprising:
- transferring multi-page program data from a block buffer to a page buffer;
- using the page buffer, buffering the multi-page program data to memory blocks;
- programming memory cells in the memory blocks using the multi-page program data with a first threshold voltage; thereafter,
- transferring the multi-page program data from the block buffer to the page buffer;
- using the page buffer, buffering the multi-page program data to the memory blocks; and
- programming the memory cells in the memory blocks using the multi-page program data with a second threshold voltage that is higher than the first voltage.

44. The method of claim 43, wherein the block buffer comprises a nonvolatile memory buffer.

45. The method of claim 44, wherein the steps of programming the memory cells with a first threshold voltage and with a second threshold voltage, respectively, comprise:
- programming the memory cells corresponding to an i-th page where "i" is a natural number;
- verifying data in the memory cells corresponding to the i-th page; and
- repeating the step of programming memory cells and the step of verifying data in the memory cells until the memory cells of the i-th page are correctly programmed.

46. The method of claim 44, wherein the block buffer stores the multi-page program data until the multi-page program data is completely stored in a corresponding one of the memory blocks.

* * * * *